US012601040B2

(12) United States Patent (10) Patent No.: US 12,601,040 B2
Huang et al. (45) Date of Patent: Apr. 14, 2026

(54) ALUMINUM SCANDIUM ALLOY TARGET AND METHOD OF MANUFACTURING THE SAME

(71) Applicant: HUNAN RARE EARTH METAL MATERIAL RESEARCH INSTITUTE CO., LTD., Changsha (CN)

(72) Inventors: Pei Huang, Changsha (CN); Meisong Huang, Changsha (CN); Zhijian Wang, Changsha (CN); Hua Liu, Changsha (CN); Yuehua Deng, Changsha (CN); Xiaobo Ma, Changsha (CN); Kang Wen, Changsha (CN); Wei Liu, Changsha (CN)

(73) Assignee: HUNAN RARE EARTH METAL MATERIAL RESEARCH INSTITUTE CO., LTD., Changsha (CN)

( * ) Notice: Subject to any disclaimer, the term of this patent is extended or adjusted under 35 U.S.C. 154(b) by 1031 days.

(21) Appl. No.: 17/633,847

(22) PCT Filed: Aug. 7, 2020

(86) PCT No.: PCT/CN2020/107595
§ 371 (c)(1),
(2) Date: Feb. 8, 2022

(87) PCT Pub. No.: WO2021/023283
PCT Pub. Date: Feb. 11, 2021

(65) Prior Publication Data
US 2022/0290279 A1 Sep. 15, 2022

(30) Foreign Application Priority Data
Aug. 8, 2019 (CN) .......................... 201910728796.5

(51) Int. Cl.
*C22C 21/00* (2006.01)
*C22F 1/04* (2006.01)
*C23C 14/34* (2006.01)

(52) U.S. Cl.
CPC ................ *C22F 1/04* (2013.01); *C22C 21/00* (2013.01); *C23C 14/3414* (2013.01)

(58) Field of Classification Search
None
See application file for complete search history.

(56) References Cited

U.S. PATENT DOCUMENTS 6,736,947 B1 5/2004 Watanabe et al.
6,929,726 B2 8/2005 Watanabe et al.
(Continued)

FOREIGN PATENT DOCUMENTS

CN 1370853 A 9/2002
CN 104480445 A 4/2015
(Continued)

OTHER PUBLICATIONS

International Search Report from International Application No. PCT/CN2020/107595 mailed Oct. 28, 2020.
(Continued)

*Primary Examiner* — Keith D. Hendricks
*Assistant Examiner* — Janell C Morillo
(74) *Attorney, Agent, or Firm* — Shih IP Law Group, PLLC

(57) ABSTRACT

Provided are an aluminum scandium alloy target and a method of manufacturing the same. The method comprises: preparing metal aluminum and metal scandium with purities of 99.99% or more respectively; mixing the metal aluminum into the metal scandium and smelting through a plurality of cycles to obtain a desired aluminum scandium alloy, in which the metal scandium account for 5-40 wt % and the (Continued)

metal aluminum account for 60-95 wt %; injecting the aluminum scandium alloy into a mold to obtain an aluminum scandium alloy target billet; and mechanically processing the billet to obtain the aluminum scandium alloy target. The method addresses the problems of the prior art in which uniform distributions of ingredients in the target are difficult to achieve, scandium is not uniformly distributed, and the target has a high oxide content, a low compactness, a low alloy purity and are unsuitable for manufacturing a sputter coating.

7 Claims, 2 Drawing Sheets

(56) References Cited

U.S. PATENT DOCUMENTS

| | | | |
|---|---|---|---|
| 2004/0140197 | A1 | 7/2004 | Watanabe et al. |
| 2005/0252584 | A1 | 11/2005 | Watanabe et al. |
| 2007/0137831 | A1 | 6/2007 | Torng et al. |
| 2008/0190764 | A1 | 8/2008 | Torng et al. |
| 2010/0285332 | A1 | 11/2010 | Lin et al. |
| 2011/0253524 | A1 | 10/2011 | Lin et al. |
| 2011/0318607 | A1 | 12/2011 | Kobayashi et al. |
| 2018/0261439 | A1* | 9/2018 | Myasnikov ............... C22F 1/04 |
| 2019/0161851 | A1 | 5/2019 | Morii et al. |

FOREIGN PATENT DOCUMENTS

| | | | | |
|---|---|---|---|---|
| CN | 107761062 | A | 3/2018 | |
| CN | 107841639 | A | 3/2018 | |
| CN | 108441827 | A | * | 8/2018 | |
| CN | 109252142 | A | * | 1/2019 | ............ C22C 1/026 |
| CN | 109312449 | A | | 2/2019 | |
| CN | 107761062 | B | | 6/2020 | |
| CN | 111455223 | A | | 7/2020 | |
| CN | 111455223 | B | | 10/2021 | |
| EP | 3467142 | A1 | | 4/2019 | |
| EP | 3467142 | A4 | | 12/2019 | |
| JP | 2006161082 | A | | 6/2006 | |
| JP | 4197579 | B2 | | 12/2008 | |
| JP | 2009035823 | A | | 2/2009 | |
| JP | 5044509 | B2 | | 10/2012 | |
| JP | 2017213185 | A1 | | 4/2019 | |
| JP | 6869237 | B2 | | 5/2021 | |
| SG | 11201810964 | U | | 1/2019 | |
| TW | 200724698 | A | | 7/2007 | |
| TW | I296286 | B | | 5/2008 | |
| TW | 201040050 | A | | 11/2010 | |
| TW | I359755 | B | | 3/2012 | |
| WO | 9934028 | A1 | | 7/1999 | |
| WO | 2010101160 | A1 | | 9/2010 | |
| WO | 2017213185 | A1 | | 12/2017 | |
| WO | 2021023283 | A1 | | 2/2021 | |

OTHER PUBLICATIONS

Page 105-106 of 'Materials and Manufacture Technique of Modish Ornament(流行饰品材料及生产工艺 )' written by yuan, Junping( 袁军平 ), etc, and published by China University of Geoscience Press on Jun. 30, 2015.

* cited by examiner

ALUMINUM SCANDIUM ALLOY TARGET AND METHOD OF MANUFACTURING THE SAME

This application claims the priority and benefits of Chinese Patent Application No. 201910728796.5 filed on Aug. 8, 2019, the whole contents of which are incorporated herein by reference.

TECHNICAL FIELD

The present disclosure relates to a technical field of processing and preparation of an aluminum alloy target, and in particular, to an aluminum scandium alloy target and a method of manufacturing the same.

BACKGROUND ART

Aluminum scandium alloy is mainly used as a sputtering target in special fields, such as in the preparation of a micro-electromechanical system (MEMS) that integrates a micro-sensor, an actuator, a signal processing and control circuit, an interface circuit, a communication component and a power supply. Generally, an aluminum scandium alloy target is used as a sputtering source for sputtering to form an aluminum scandium alloy film. However, the metal scandium has a melting point up to 1541° C. and has active chemical properties, and the melting point is quite different from that of aluminum. Thus, when scandium and aluminum are directly fused, they are not easy to mix evenly, which causes serious segregation, and seriously affects the quality of the film.

Therefore, researching and developing a method of manufacturing a high-purity and dense aluminum scandium alloy target is of great practical significance for the development of sputtering targets in key fields.

In the prior art, there are several methods for manufacturing the aluminum scandium alloy and the aluminum scandium alloy target:

1. The aluminum scandium alloy is prepared by a mixing method, which includes directly adding metal scandium to aluminum alloy, obtaining the aluminum scandium alloy by injecting, and then preparing for obtaining the aluminum scandium alloy target. The content of scandium in the aluminum scandium alloy prepared by this method ranges from 0.1-15%, it is difficult to achieve uniformity of ingredients in the obtained target, and the distribution of scandium is also uneven.

2. The target is obtained by using a powder metallurgy method, which includes directly mixing, pressing and sintering scandium powder and aluminum powder to obtain the target. The aluminum scandium alloy target prepared by this method is relatively uniform and has a large optional range of scandium content, but the target has a high oxygen content and low density.

3. The aluminum scandium alloy is prepared by a thermal reduction method and a molten salt electrolysis method. The alloy prepared by this method has low alloy purity, and cannot be used to prepare an aluminum scandium alloy target for a sputter coating.

SUMMARY

An object of the present disclosure is to provide a high-performance aluminum scandium alloy target and a method of manufacturing the same, in order to solve the problems of the prior art in which the target has non-uniform composition distribution, high oxide content, low compactness, small optional range of scandium content, low alloy purity, and cannot be used for a sputter coating.

The above object is achieved by the following technical solutions:

According to an aspect of the present disclosure, the present disclosure provides a method of manufacturing an aluminum scandium alloy target, including: preparing metal aluminum with a purity of 99.99% or more and metal scandium with a purity of 99.99% or more; mixing the metal aluminum into the metal scandium and smelting through a plurality of cycles of mixing and smelting to obtain a desired aluminum scandium alloy, in which the metal scandium account for 5-40 wt % and the metal aluminum account for 60-95 wt %; injecting the aluminum scandium alloy into a mold to obtain an aluminum scandium alloy target billet; and machining the aluminum scandium alloy target billet to obtain the aluminum scandium alloy target.

Preferably, in the step of mixing the metal aluminum into the metal scandium and smelting, a weight of the metal aluminum mixed into the metal scandium in each cycle is less than or equal to 200% of the total weight of the metal scandium.

Preferably, temperature is maintained for 5-15 minutes during smelting in each cycle, and is cooled, and then a next cycle of mixing and smelting is performed until the desired aluminum scandium alloy is obtained. Wherein, the desired aluminum scandium alloy is generally an aluminum scandium alloy containing the scandium with a content of, preferably, 5 to 40 wt % in the present disclosure.

Preferably, the smelting is performed in a levitation furnace in a vacuum state less than 1 Pa and under inert gas atmosphere.

Preferably, the injecting is performed using a water-cooled copper casting mold for rapid cooling injecting after the components in aluminum scandium alloy reach an expected distribution, but it is not limited thereto, and other molds that can achieve rapid cooling may also be used for injecting.

Preferably, the manufacturing method further includes steps of peeling, die forging, hot rolling, leveling and annealing the aluminum scandium alloy target billet before the step of machining the aluminum scandium alloy target billet.

Further, the steps of peeling, die forging, hot rolling, leveling and annealing the aluminum scandium alloy target billet includes the following steps: peeling the aluminum scandium alloy target billet (i.e. removing the skin and turning the billet to having a flat surface); maintaining the peeled target billet at a temperature of 300° C.-750° C. for 60 minutes, then die forging the target billet under a pressure of 100 MPa-400 MPa with a forging ratio of 1.05-1.2, wherein in the forging process, as the forging ratio increases, internal pores are compressed, dendrites in as cast state are broken, and grains are greatly refined; maintaining the die-forged aluminum scandium target billet at 300° C.-750° C. for 20-50 minutes and then rolling the aluminum scandium target billet, wherein a total reduction is less than or equal to 35%; leveling the rolled target billet; and finally, stress-relief annealing the aluminum scandium target billet in a vacuum annealing furnace at a temperature of 300° C.-750° C. during a time period of 30-60 minutes and under t inert atmosphere.

Further, the obtained aluminum scandium alloy target billet has oxide content less than 100 ppm and an average grain size less than 100 μm.

According to another aspect of the present disclosure, the present disclosure provides an aluminum scandium alloy target which is manufactured according to the above-mentioned method of manufacturing the aluminum scandium alloy target.

Preferably, the content of scandium of the aluminum scandium alloy target is 5-40 wt %.

Preferably, the aluminum scandium alloy target has oxide content less than 100 ppm and an average grain size less than 100 μm.

In the present disclosure, the metal aluminum and the metal scandium are prepared and mixed with a reasonable ratio, wherein the metal aluminum is mixed into the metal scandium through a plurality of cycles, a desired aluminum scandium alloy is obtained through levitation smelting and injecting through a plurality of cycles, and after the aluminum scandium alloy is injected into a mold, an aluminum scandium alloy target billet is obtained, finally, an aluminum scandium alloy target is obtained through machining. Compared with the prior art, the present disclosure has the following advantageous effects: the aluminum scandium alloy target has low oxygen content, high compactness, high purity, fine grains, and uniform composition distribution; can be used as an aluminum scandium alloy target for a sputter coating to improve the quality of the film; and has the advantages of high purity of aluminum scandium alloy and large optional range of scandium content.

The aluminum scandium alloy target billet obtained through levitation smelting and injecting through a plurality of cycles has uniform composition distribution, high purity and low oxygen content; Through processes such as pressure processing and heat treatment on the aluminum scandium alloy target billet, the target with high purity, high compactness, fine grains and uniform internal structure can be obtained, which meets the requirements for a high-purity and high-compactness aluminum scandium alloy target for integrated circuit sputtering coating.

BRIEF DESCRIPTION OF THE DRAWINGS

In order to make the content of the present disclosure easier to be understood clearly, the following description further describes the present disclosure in detail based on specific embodiments of the present disclosure in conjunction with the accompanying drawings, in which.

DETAILED DESCRIPTION OF THE EMBODIMENTS

Figure 1:
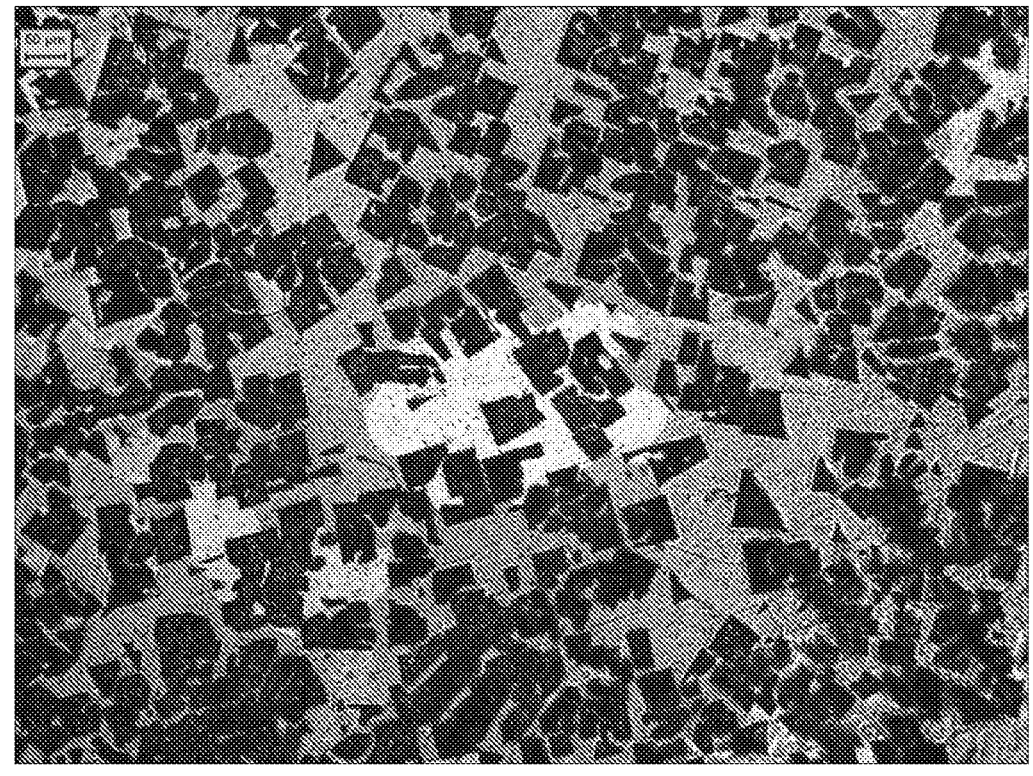
FIG. 1 is a photo of an internal microstructure of the aluminum scandium alloy target billet in as cast state obtained in a second embodiment of the present disclosure.

Hereinafter, the technical solutions of the present disclosure will be clearly and completely described in combination with the embodiments of the present disclosure.

The embodiments of the present disclosure provide a method of manufacturing an aluminum scandium alloy target, including: preparing metal aluminum with a purity of 99.99% or more and metal scandium with a purity of 99.99% or more (no particle size requirement); mixing the metal aluminum into the metal scandium and smelting through a plurality of cycles of mixing and smelting to obtain a desired aluminum scandium alloy, in which the metal scandium account for 5-40 wt % and the metal aluminum account for 60-95 wt %, and the weight of metal aluminum mixed into the metal scandium in each cycle is less than or equal to 200% of the total weight of the metal scandium, and the temperature is maintained for 5-15 minutes during smelting in each cycle and then perform a next cycle of mixing and smelting until the desired aluminum scandium alloy is obtained; injecting the aluminum scandium alloy melt into a water-cooled copper mold to obtain an aluminum scandium alloy target billet; and subjecting the aluminum scandium alloy target billet to pressure processing and heat treatment to obtain the aluminum scandium alloy target.

In the present disclosure, the metal aluminum and the metal scandium are prepared and mixed with a reasonable ratio, the metal aluminum is mixed into the metal scandium through a plurality of cycles, the weight of the metal aluminum mixed into the metal scandium mixed into the metal scandium is less than or equal to exceed 200% of the total mass of the scandium, a desired aluminum scandium alloy is obtained through levitation smelting and injecting through a plurality of cycles, the aluminum scandium alloy is injected into a mold to obtain an aluminum scandium alloy target billet, and an aluminum scandium alloy target is obtained through machining. The obtained aluminum scandium alloy target has uniform composition distribution, high purity, low oxygen content, fine grains and high compactness, improves the quality of the film when it is used as an aluminum scandium alloy target for a sputter coating to, and also has the advantages of high purity of aluminum scandium alloy and large optional range of scandium content.

First Embodiment 3600 g metal aluminum with purity above 99.99% and 400 g metal scandium with purity above 99.99% are prepared, and the metal aluminum is divided into 7 parts. The metal scandium is put into a water-cooled copper crucible, a first part of metal aluminum is put into a feeder, and a levitation furnace is evacuated with a vacuum degree below 1 Pa and filled with an inert gas. After the metal scandium is melted, the first part of aluminum is added, and they are smelted and maintained the temperature for 10 minutes, and after cooled, take the alloy ingot out, turn it around and put it into the water-cooled copper crucible again, a second part of metal aluminum is then put into the feeder, and smelting and maintaining temperature is performed again according to the above method; the above steps is repeated until an aluminum scandium alloy with a scandium content of 10% is obtained; finally, the alloy melt is injected into a water-cooled copper mold having a diameter of 200 mm to obtain an aluminum scandium alloy target billet.

After the above aluminum scandium alloy ingot is peeled, the ingot and a steel mold having a diameter of 215 mm are maintained at 520° C. for 60 minutes. Then, the aluminum scandium alloy ingot and the mold are put under a forging press for die forging at a pressure of 100 MPa. After the die-forged aluminum scandium target billet is maintained at 520° C. for 20 minutes, the target billet is rolled. The target billet is rolled to have a diameter of 320 mm, and finally the aluminum scandium target is leveled while it is hot.

The target is then annealed in a vacuum annealing furnace, wherein the vacuum annealing furnace is evacuated and filled with argon gas, and the target is maintained at 420° C. for 30 minutes; after the furnace is cooled, a surface of the target is machined, so as to obtain an aluminum scandium target having a diameter of 310 mm with a scandium content of 10% finally. Through testing on the target, the target has high purity, high compactness, an oxygen content of 56 ppm, and an average grain size of 67 μm.

Second Embodiment 3200 g metal aluminum with purity above 99.99% and 800 g metal scandium with purity above 99.99% are prepared, and the metal aluminum is divided into 3 parts. The metal scandium is put into a water-cooled copper crucible, a first part of metal aluminum is put into a feeder, and a levitation furnace is evacuated with a vacuum degree below 1 Pa and filled with an inert gas. After the metal scandium is melted, the first part of aluminum is added, and they are smelted and maintained the temperature for 10 minutes, and after cooled, take the alloy ingot out, turn it around and put it into the water-cooled copper crucible again, a second part of metal aluminum is then put into the feeder, the smelting is performed repeatedly according to the above method, until an aluminum scandium alloy with a scandium content of 20% is obtained. Finally, the alloy melt is injected into a water-cooled copper mold having a diameter of 200 mm to obtain an aluminum scandium alloy target billet. A photo of the internal microstructure of the aluminum scandium alloy target billet is shown in FIG. 1.

After the above aluminum scandium alloy ingot is peeled, the aluminum scandium alloy ingot and a steel mold having a diameter of 215 mm are maintained at 610° C. for 60 minutes. Then, the aluminum scandium alloy ingot and the mold are put under a forging press for die forging at a pressure of 150 MPa.

After the die-forged aluminum scandium target billet is maintained at 610° C. for 20 minutes, the target billet is rolled. The target is rolled to have a diameter greater than 290 mm, and finally the aluminum scandium target is leveled while it is hot.

Figure 2:
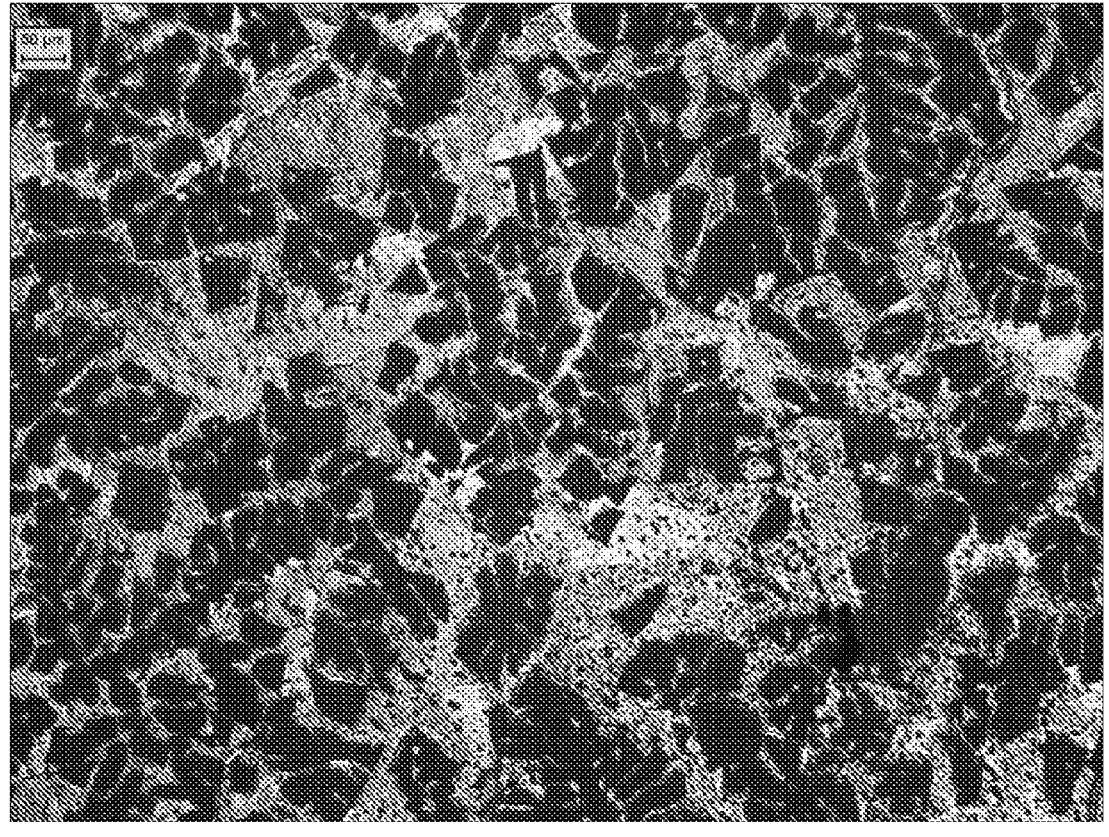
FIG. 2 is a photo of an internal microstructure of the aluminum scandium alloy target obtained in the second embodiment of the present disclosure.

The target is then annealed in a vacuum annealing furnace, wherein the vacuum annealing furnace is evacuated and filled with argon gas, and the target is maintained at 510° C. for 30 minutes; after the furnace is cooled, a surface of the target is machined, so as to obtain an aluminum scandium target having a diameter of 280 mm with a scandium content of 20% finally. A photo of the internal microstructure of the aluminum scandium alloy target is shown in FIG. 2. Through testing on the final target, the target has high purity, high compactness, an oxygen content of 48 ppm, and an average grain size of 58 μm.

Third Embodiment 2800 g metal aluminum with purity above 99.99% and 1200 g metal scandium with purity above 99.99% are prepared, and the metal aluminum is divided into 2 parts. The metal scandium is put into a water-cooled copper crucible, a first part of metal aluminum is put into a feeder, and a levitation furnace is evacuated with a vacuum degree below 1 Pa and filled with an inert gas. After the metal scandium is melted, the first part of aluminum is added, and they are smelted and maintained the temperature for 10 minutes, and after cooled, take the alloy ingot out, turn it around and put it into the water-cooled copper crucible again, a second part of metal aluminum is then put into the feeder, the smelting is performed repeatedly according to the above method, until an aluminum scandium alloy with a scandium content of 30% is obtained. Finally, the alloy melt is injected into a water-cooled copper mold having a diameter of 200 mm to obtain an aluminum scandium alloy target billet.

After the above aluminum scandium alloy ingot is peeled, the aluminum scandium alloy ingot and a steel mold having a diameter of 210 mm are maintained at 700° C. for 60 minutes. Then, the aluminum scandium alloy ingot and the mold are put under a forging press for die forging at a pressure of 200 MPa.

After the die-forged aluminum scandium target billet is maintained at 700° C. for 20 minutes, the target billet is rolled. The target is rolled to have a diameter of 270 mm, and finally the aluminum scandium target is leveled while it is hot.

The target is then annealed in a vacuum annealing furnace, wherein the vacuum annealing furnace is evacuated and filled with argon gas, then the target is maintained at 600° C. for 30 minutes; after the furnace is cooled, a surface of the target is machined, so as to obtain an aluminum scandium target having a diameter of 260 mm with a scandium content of 30% finally. Through testing the final target, the target has high purity, high compactness, an oxygen content of 73 ppm, and an average grain size of 80 μm.

What is claimed is:

1. A method of manufacturing an aluminum scandium alloy target, comprising:
   preparing metal aluminum with a purity of 99.99% or more and metal scandium with a purity of 99.99% or more;
   mixing the metal aluminum into the metal scandium and smelting through a plurality of cycles of mixing and smelting to obtain a desired aluminum scandium alloy in which the metal scandium account for 5-40 wt % and the metal aluminum account for 60-95 wt %;
   injecting the aluminum scandium alloy into a mold to obtain an aluminum scandium alloy target billet; and
   machining the aluminum scandium alloy target billet to obtain the aluminum scandium alloy target,
   wherein, in the step of mixing the metal aluminum into the metal scandium and smelting, a weight of the metal aluminum mixed into the metal scandium in each cycle is less than or equal to 200% of the total weight of the metal scandium.

2. The method of claim 1, wherein temperature is maintained for 5-15 minutes during smelting in each cycle, and is cooled, and then a next cycle of mixing and smelting is performed until the desired aluminum scandium alloy is obtained.

3. The method of claim 1, wherein the smelting is performed in a levitation furnace in a vacuum state less than 1 Pa and under inert gas atmosphere.

4. The method of claim 1, wherein the mold is a water-cooled copper casting mold.

5. The method of claim 1, further comprises steps of peeling, die forging, hot rolling, leveling and annealing the aluminum scandium alloy target billet before the step of machining the aluminum scandium alloy target billet.

6. The method of claim 5, wherein the steps of peeling, die forging, hot rolling, leveling and annealing the aluminum scandium alloy target billet comprises:
   peeling the aluminum scandium alloy target billet;
   maintaining the peeled target billet at a temperature of 300° C.-750° C. for 60 minutes, then die forging the target billet under a pressure of 100 MPa-400 MPa with a forging ratio of 1.05-1.2;
   maintaining the die-forged aluminum scandium target billet at 300° C.-750° C. for 20-50 minutes and then rolling the aluminum scandium target billet, wherein a total reduction is less than or equal to 35%;

leveling the rolled aluminum scandium target billet; and stress relief annealing the aluminum scandium target billet in a vacuum annealing furnace at a temperature of 300° C.-750° C. during a time period of 30-60 minutes and under inert gas atmosphere.

7. The method of claim 6, wherein the obtained aluminum scandium alloy target billet has oxide content less than 100 ppm and an average grain size less than 100 μm.

\* \* \* \* \*